US009960243B2

(12) United States Patent
Aichinger et al.

(10) Patent No.: US 9,960,243 B2
(45) Date of Patent: *May 1, 2018

(54) SEMICONDUCTOR DEVICE WITH STRIPE-SHAPED TRENCH GATE STRUCTURES AND GATE CONNECTOR STRUCTURE

(71) Applicant: Infineon Technologies AG, Neubiberg (DE)

(72) Inventors: Thomas Aichinger, Villach (AT); Wolfgang Bergner, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/358,316

(22) Filed: Nov. 22, 2016

(65) Prior Publication Data

US 2017/0077251 A1 Mar. 16, 2017

Related U.S. Application Data

(63) Continuation of application No. 14/976,566, filed on Dec. 21, 2015, now Pat. No. 9,530,850.

(30) Foreign Application Priority Data

Dec. 22, 2014 (DE) .................... 10 2014 119 466

(51) Int. Cl.
*H01L 29/51* (2006.01)
*H01L 29/423* (2006.01)
(Continued)

(52) U.S. Cl.
CPC .... *H01L 29/4236* (2013.01); *H01L 21/02236* (2013.01); *H01L 21/049* (2013.01);
(Continued)

(58) Field of Classification Search
CPC ............ H01L 29/7397; H01L 29/0696; H01L 29/1608; H01L 29/4236; H01L 21/823462
See application file for complete search history.

(56) References Cited

U.S. PATENT DOCUMENTS 7,335,946 B1    2/2008  Bhalia et al.
7,416,947 B2    8/2008  Darwish
(Continued)

FOREIGN PATENT DOCUMENTS

DE          103 24 754 A1      1/2005
DE    11 2008 002 423 T5     11/2010
(Continued)

OTHER PUBLICATIONS

Office Action communication of the German Patent and Trademark Office for Appln. Ser. No. 102014119466.7, dated Apr. 11, 2015.
Communication from Japanese Patent Office re 2015-250556 (machine translation provided).

*Primary Examiner* — Fei Fei Yeung Lopez
(74) *Attorney, Agent, or Firm* — Slater Matsil, LLP

(57) ABSTRACT

A semiconductor device includes a transistor cell with a stripe-shaped trench gate structure that extends from a first surface into a semiconductor body. A gate connector structure at a distance to the first surface is electrically connected to a gate electrode in the trench gate structure. A gate dielectric separates the gate electrode from the semiconductor body. First sections of the gate dielectric outside a vertical projection of the gate connector structure are thinner than second sections within the vertical projection of the gate connector structure.

19 Claims, 9 Drawing Sheets

(51) Int. Cl.
| | |
|---|---|
| *H01L 29/739* | (2006.01) |
| *H01L 29/16* | (2006.01) |
| *H01L 29/06* | (2006.01) |
| *H01L 21/8234* | (2006.01) |
| *H01L 29/78* | (2006.01) |
| *H01L 21/02* | (2006.01) |
| *H01L 21/04* | (2006.01) |
| *H01L 23/00* | (2006.01) |

(52) U.S. Cl.
CPC ...... *H01L 21/823462* (2013.01); *H01L 24/48* (2013.01); *H01L 29/0696* (2013.01); *H01L 29/1608* (2013.01); *H01L 29/4238* (2013.01); *H01L 29/42368* (2013.01); *H01L 29/7397* (2013.01); *H01L 29/7813* (2013.01); *H01L 21/02255* (2013.01)

(56) References Cited

U.S. PATENT DOCUMENTS

| | | | |
|---|---|---|---|
| 9,530,850 B2 * | 12/2016 | Aichinger | ......... H01L 21/82346 |
| 2005/0161732 A1 | 7/2005 | Mizukami | |
| 2012/0049202 A1 * | 3/2012 | Nakano | ............... H01L 29/7813 |
| | | | 257/77 |

FOREIGN PATENT DOCUMENTS

| | | |
|---|---|---|
| JP | 2005-236267 | 9/2005 |
| JP | 2008-016518 | 1/2008 |
| JP | 2008-300529 | 12/2008 |
| JP | 2010-147182 A | 7/2010 |
| JP | 2010-541289 | 12/2010 |
| JP | 2012-164707 A | 8/2012 |
| JP | 2014-027293 | 2/2014 |
| JP | WO 2013-161116 A | 12/2015 |

* cited by examiner

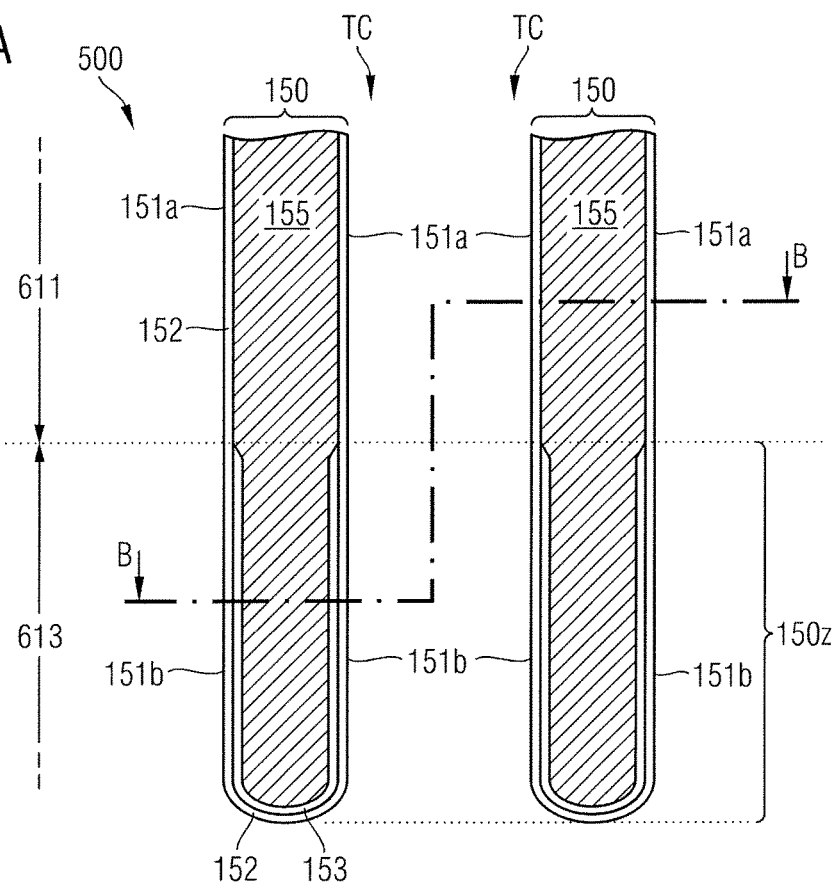
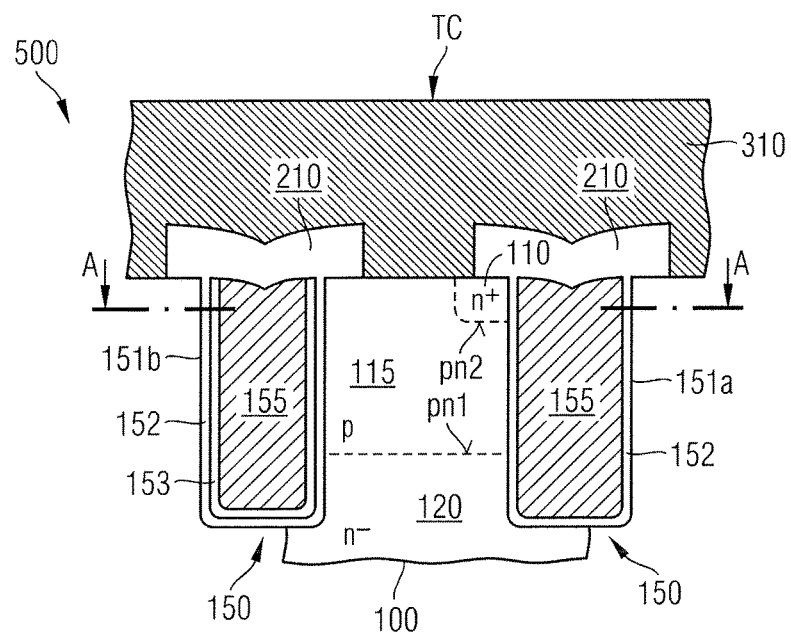

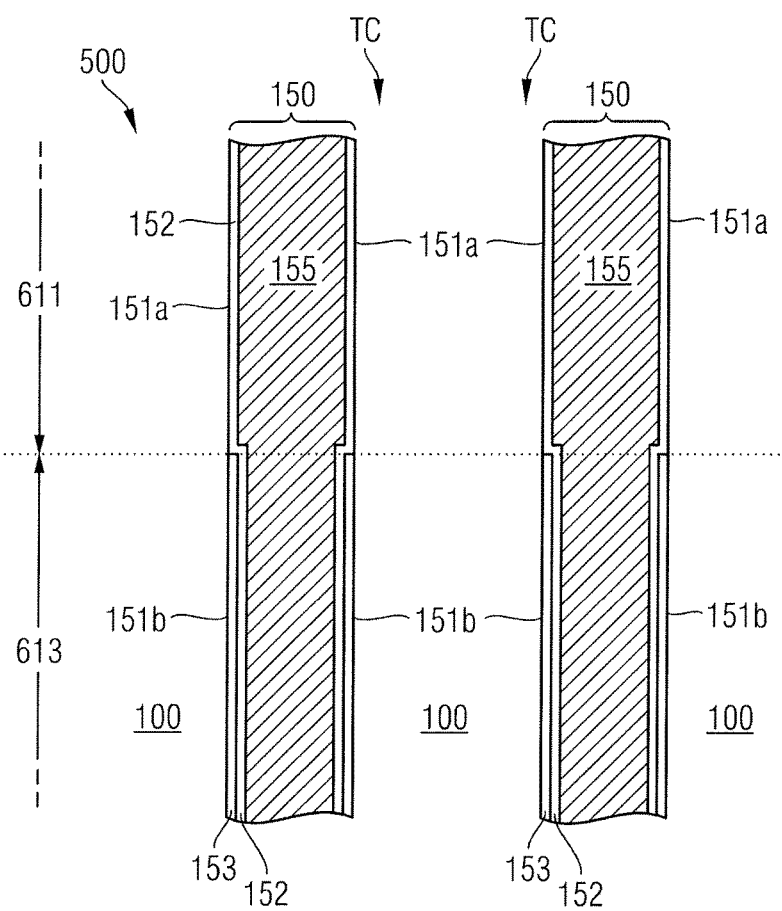

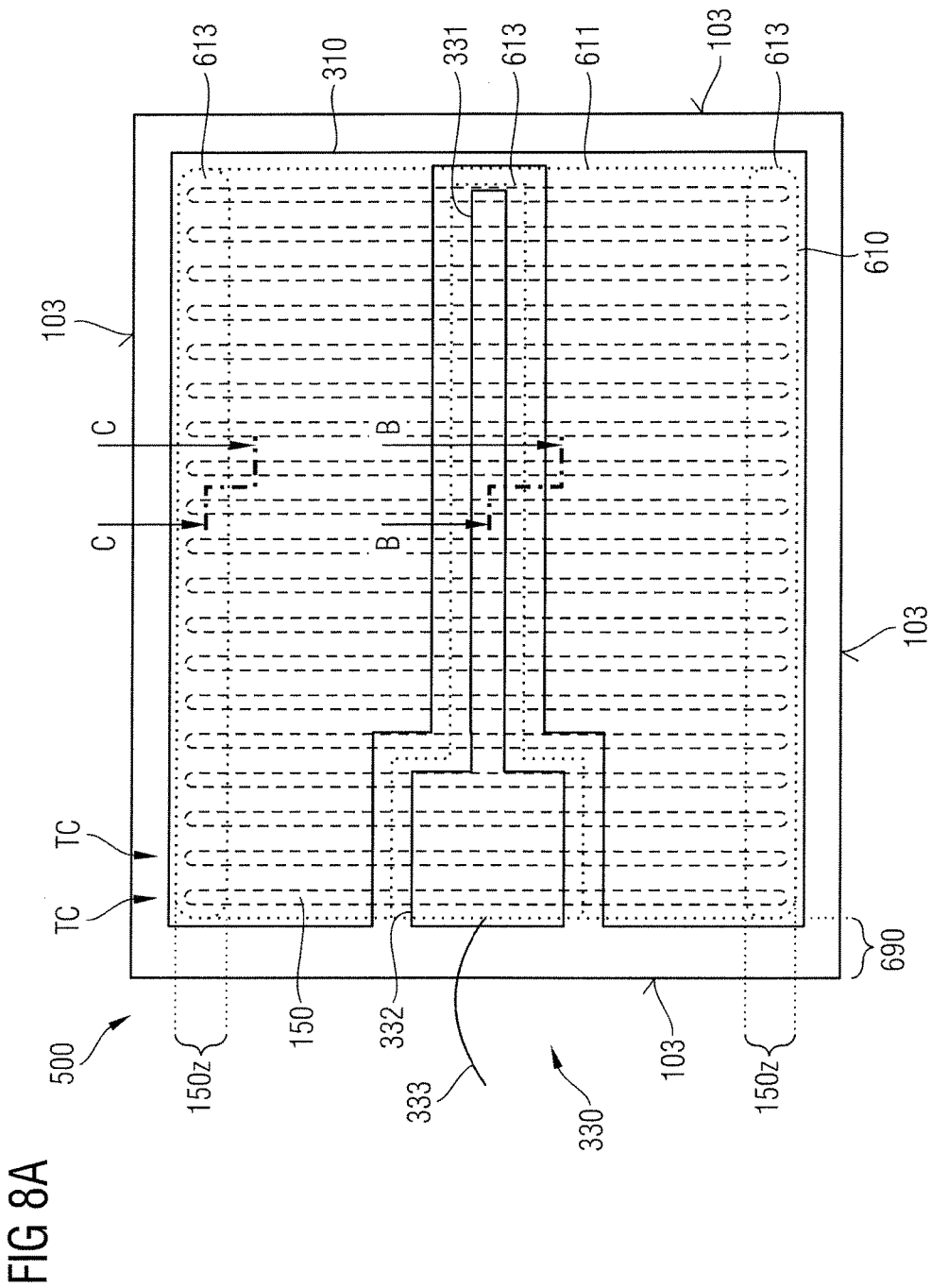

SEMICONDUCTOR DEVICE WITH STRIPE-SHAPED TRENCH GATE STRUCTURES AND GATE CONNECTOR STRUCTURE

CROSS-REFERENCE TO RELATED APPLICATION

This application is a continuation of U.S. application Ser. No. 14/976,566 filed Dec. 21, 2015 and entitled "Semiconductor Device With Stripe-Shaped Trench Gate Structures and Gate Connector Structure" which claims priority to German Application Ser. No. 102014119466.7 filed Dec. 22, 2014 and entitled "Semiconductor Device With Stripe-Shaped Trench Gate Structures and Gate Connector Structure".

BACKGROUND

Power semiconductor devices such as IGFETs (insulated gate field effect transistors) are typically based on stripe-shaped transistor cells with gate electrodes extending along a horizontal direction through a transistor cell area of a semiconductor body. At a front side of the semiconductor body gate connector structures electrically connect the gate electrodes with a gate terminal of the semiconductor device or with an output of an integrated gate driver circuit.

It is desirable to improve the reliability of power semiconductor devices.

SUMMARY

According to an embodiment a semiconductor device includes a transistor cell that includes a stripe-shaped trench gate structure extending from a first surface into a semiconductor body. A gate connector structure is at a distance to the first surface. The gate connector structure is electrically connected to a gate electrode in the trench gate structure. A gate dielectric separates the gate electrode from the semiconductor body. First sections of the gate dielectric outside a vertical projection of the gate connector structure are thinner than second sections within the vertical projection of the gate connector structure.

According to another embodiment a semiconductor device includes a transistor cell that includes a stripe-shaped trench gate structure extending from a first surface into a semiconductor body. The transistor cell includes an active section through which a load current flows in a vertical direction, which is perpendicular to the first surface, when the transistor cell is in an on-state as well as an idle section through which no load current flows in the vertical direction when the transistor cell is in the on-state. A second section of the gate dielectric in the idle section includes at least one sublayer more than a first section of the gate dielectric in the active section.

According to a further embodiment, a semiconductor device includes a transistor cell that includes a stripe-shaped trench gate structure extending from a first surface into a semiconductor body that is based on silicon carbide. The transistor cell includes an active section through which a load current flows in a vertical direction, which is perpendicular to the first surface, when the transistor cell is in an on-state as well as an idle section through which no load current flows in the vertical direction when the transistor cell is in the on-state. A second section of the gate dielectric in the idle section is thicker than a first section of the gate dielectric in the active section.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 5A is a schematic horizontal cross-sectional view of a portion of a semiconductor device according to an embodiment concerning multilayer gate dielectrics in end sections of trench gate structures.

FIG. 5B is a schematic vertical cross-sectional view of the semiconductor device portion of FIG. 5A along line B-B.

FIG. 6 is a schematic horizontal cross-sectional view of a portion of a semiconductor device according to an embodiment with an additional sublayer in idle regions, wherein the additional sublayer is formed before the formation of gate dielectrics in active regions.

FIG. 8A is a schematic plan view of a portion of an IGFET based on silicon carbide according to an embodiment concerning enhanced gate dielectric sections in the vertical projection of gate connector structures and end portions.

DETAILED DESCRIPTION

In the following detailed description, reference is made to the accompanying drawings, which form a part hereof and in which are shown by way of illustrations specific embodiments in which the invention may be practiced. Other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" may include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
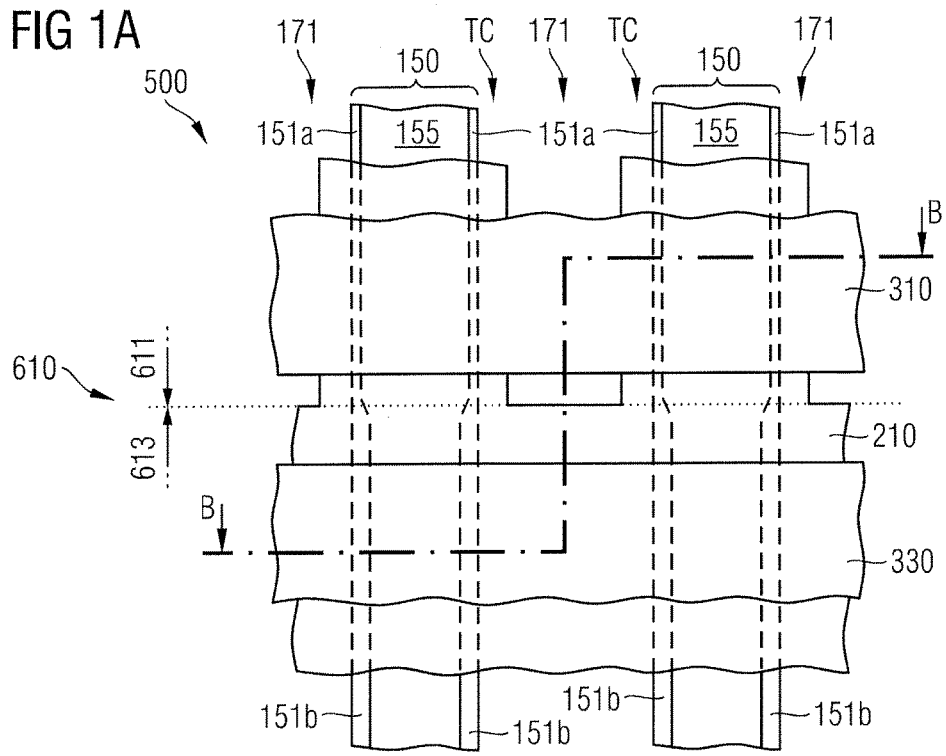
FIG. 1A is a schematic plan view of a portion of a semiconductor device according to an embodiment concerning thick gate dielectric sections in the vertical projection of gate connector structures.
Figure 1B:
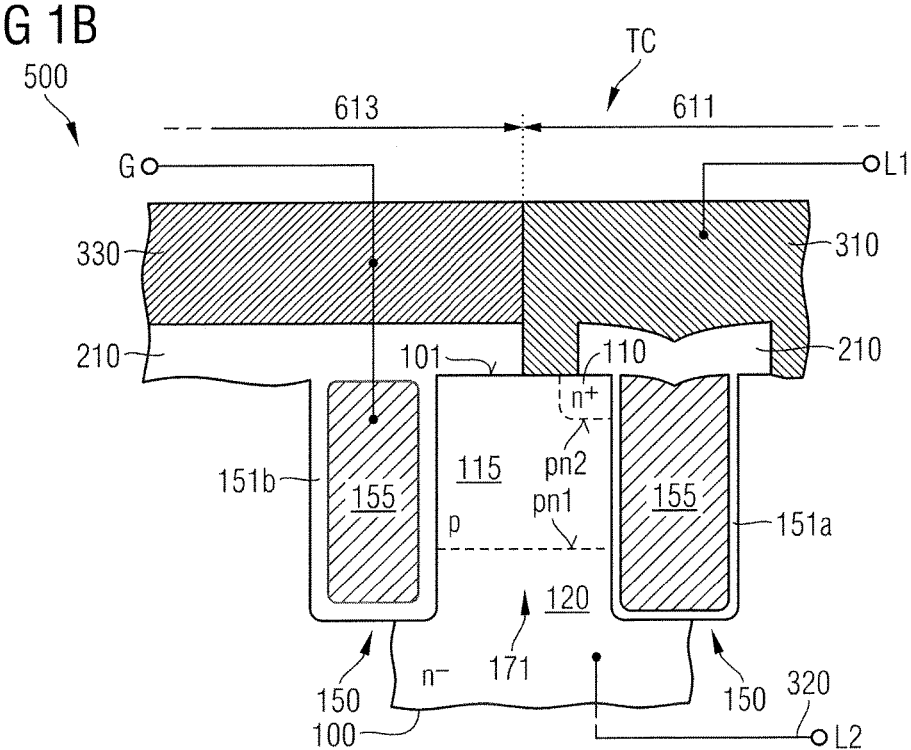
FIG. 1B is a schematic vertical cross-sectional view of the semiconductor device portion of FIG. 1A along line B-B.

FIGS. 1A to 1B refer to a semiconductor device 500 including transistor cells TC. The semiconductor device 500 may be or may include an IGFET (insulated gate field effect transistor), for example an MOSFET (metal oxide semiconductor FET) in the usual meaning including FETs with metal gates as well as FETs with non-metal gates, an IGBT (insulated gate bipolar transistor), or an MCD (MOS controlled diode), by way of example.

The semiconductor device 500 is based on a semiconductor body 100 from crystalline semiconductor material, such as silicon (Si), germanium (Ge), silicon germanium (SiGe), gallium arsenide (GaAs) or any other A$_{III}$B$_V$ semiconductor. According to an embodiment, the semiconductor body 100 is made of a single crystalline semiconductor material having a band gap of 2.0 eV or higher such as Gallium Nitride (GaN) or Silicon Carbide (SiC). For example, the semiconductor material is Silicon Carbide SiC, for example 2H-SiC (SiC of the 2H polytype), 4H-SiC, 6H-SiC or 15R-SiC.

The semiconductor body 100 has a first surface 101, which may be approximately planar or which may be given by a plane spanned by coplanar surface sections or which includes staggered parallel surface sections at a front side. On the back, an opposite second surface extends parallel to the first surface 101. A distance between the first surface 101 at the front side and the second surface on the back is selected to achieve a specified blocking voltage and may be in the range of several pm to several hundred pm. The normal to the first surface 101 defines a vertical direction. Directions parallel to the first surface 101 are horizontal directions.

Transistor cells TC are formed along stripe-shaped trench gate structures 150 extending from the first surface 101 into the semiconductor body 100. The trench gate structures 150 extend along a first horizontal direction through a transistor cell area 610.

Semiconducting portions of the transistor cells TC are formed in active mesa sections 171 of the semiconductor body 100 between neighboring gate structures 150. The active mesa sections 171 include body zones 115 that form first pn junctions pn1 with a drift structure 120 and second pn junctions pn2 with source zones 110, wherein the body zones 115 separate the source zones 110 from the drift structure 120. The source zones 110 are oriented to the front side and may directly adjoin the first surface 101. The drift structure 120 is oriented to the back and may directly adjoin the second surface.

An ohmic contact electrically connects the source zones 110 with a first load electrode 310 at the front side. The drift structure 120 may be electrically connected or coupled to a second load electrode 320 through an ohmic resistance or a further pn junction.

Each of the first and second load electrodes 310, 320 may consist of or contain, as main constituent(s), aluminum (Al), copper (Cu), or alloys of aluminum or copper such as AlSi, AlCu or AlSiCu. According to other embodiments, at least one of the first and second load electrodes 310, 320 may contain, as main constituent(s), nickel (Ni), titanium (Ti), tungsten (W), tantalum (Ta), Vanadium (V), silver (Ag), gold (Au), tin (Sn), platinum (Pt), and/or palladium (Pd). For example, at least one of the first and second load electrodes 310, 320 may include two or more sub-layers, wherein each sub-layer contains one or more of Ni, Ti, V, Ag, Au, W, Sn, Pt, and Pd as main constituent(s), e.g., a silicide, a nitride and/or an alloy.

The first load electrode 310 may form or may be electrically connected or coupled to a first load terminal L1, which may be an anode terminal of an MCD, a source terminal of an IGFET or an emitter terminal of an IGBT. The second load electrode 320 may form or may be electrically connected or coupled to a second load terminal L2, which may be a cathode terminal of an MCD, a drain terminal of an IGFET or a collector terminal of an IGBT.

Each trench gate structure 150 includes a conductive gate electrode 155 which may include or consist of a heavily doped polycrystalline silicon layer or a metal-containing layer. The trench gate structures 150 further include a gate dielectric 151 separating the gate electrode 155 from the semiconductor body 100. The gate dielectric 151 may include or consist of a semiconductor dielectric, for example thermally grown or deposited semiconductor oxide, for example silicon oxide, a semiconductor nitride, for example deposited or thermally grown silicon nitride, a semiconductor oxynitride, for example silicon oxynitride, or any combination thereof.

The gate dielectrics 151 capacitively couple the gate electrodes 155 to the body zones 115. When a potential at the gate electrodes 155 exceeds a threshold voltage of the semiconductor device 500, minority charge carriers in the body zones 155 form inversion channels connecting the source zones 110 with the drift structure 120 and the semiconductor device 100 turns on. In the on-state a load current flows through the semiconductor body 100 in approximately the vertical direction.

An interlayer dielectric 210 is sandwiched between the first load electrode 310 and the gate electrodes 155 and dielectrically insulates the first load electrode 310 from the gate electrodes 155. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

A gate connector structure 330 is formed at the front side at a distance to the first surface 101 of the semiconductor body 100. The gate connector structure 330 is electrically connected to the gate electrodes 155 and may form or may be electrically connected or coupled to a gate terminal G.

In the on-state the load current almost exclusively flows in an active region 611 outside the vertical projection of the gate connector structure 330 and no load current flows through the semiconductor body 100 in the vertical direction in an idle region 613 in the vertical projection of the gate connector structure 330. The semiconductor body 100 may include further idle regions, e.g., along trench end sections of the transistor cells TC.

In the idle regions 613 the source zones 110 may be absent, wherein no doped zones forming pn junctions with the body zones 115 are formed between the first surface 101 and the body zones 115. Further in the idle regions 613, the body zones 115 may include sections with higher dopant concentration to reduce an effective voltage drop across the concerned portions of the gate dielectrics 151. According to other embodiments, the idle regions 613 may include doped zones, which are formed between the first surface 101 and the body zones 115, form pn junctions with the body zones 115, but which are without electric connection to the first load electrode 310.

The gate connector structure 330 may include at least one of a gate pad, a gate finger, and a gate runner electrically connected to the gate electrodes 155, respectively. A gate pad may be a metal pad suitable as a landing pad for a bond wire or another chip-to-lead frame or chip-to-chip connection like a soldered clip. The gate pad may be arranged between the first load electrode 310 and a side surface 103 of the semiconductor body 100 or in a center portion of the semiconductor body 100.

A gate runner may be a metal line surrounding a transistor cell area 610. A gate finger may be a metal line running across a transistor cell area and dividing the transistor cell area 610 in active regions 611 on opposite sides of an idle region 613 in the vertical projection of the gate finger.

First sections 151a of the gate dielectrics 151 in active regions 611 outside the vertical projection of the gate connector structures 330 are thinner than second sections 151b of the gate dielectric 151 in idle regions 613 of the transistor cell area 610 in the vertical projection of the gate connector structures 330. According to an embodiment the first and second sections 151a, 151b are formed from the same material(s). The second sections 151b are at least 10%, for example, at least 20% or at least 50% thicker than the first sections 151a.

According to another embodiment, the second sections 151b include a first sublayer of the same configuration and thickness as the first sections 151a and a second sublayer from the same material or from another material.

The following description refers to n-channel transistor cells TC with p-doped body zones 115, n-doped source zones 110 and n-doped drift structures 120. Equivalent considerations apply to p-channel transistor cells TC with n-doped body zones 115, p-doped source zones 110 and p-doped drift structures 120.

Portions of the body zones 115 in the idle regions 613 may be more heavily p-doped than the body zones 115 in the active regions 611 such that a positive gate voltage applied to the gate electrode 155 induces a depletion layer along the concerned trench gate structure 150. The depletion layer reduces the effective voltage drop across the gate dielectric 151 and improves electric separation of the concerned semiconductor region from the active regions 611 of a transistor cell area 610.

But a positive gate voltage higher than the threshold voltage of the p-doped portions may induce an inversion layer deactivating the shielding, since the semiconductor/insulator interface in the idle regions 613 gets connected to the source potential. Further, a negative gate voltage applied to the gate electrodes 155 may induce an accumulation layer along the gate dielectrics 151, wherein the accumulation layer may reduce the shielding effect of the p-doped portion.

The increased thickness of the gate dielectric 151 in the vertical projection of the gate connector structures 330 reduces the effective field along the gate dielectric 151 and locally further increases the threshold voltage. The increased threshold voltage in the idle region 613 supports the electric separation of the idle region 613 from the active regions 611.

In addition, the weakest point of the gate dielectric 151 is secured within the active regions 611 outside the vertical projection of the gate connector structure 330. Portions of the gate dielectric 151 in the idle regions 613, e.g., in the vertical projection of the gate connector structures 330 contribute to the overall gate dielectric reliability. If a percolation path forms or if an extrinsic defect is located by chance in the idle regions 613, the gate dielectric 151 may breakdown although the concerned transistor section is not active. Typically, device reliability may be increased by increasing the thickness of the gate dielectric 151 resulting in a higher threshold voltage and higher resistance of the semiconductor device 500 in the on-state. Instead, by providing the second sections 151b of the gate dielectric 151 in the vertical projection of the gate connector structure 330 thicker than the first sections 151a in the active regions 611 outside the vertical projection of the gate connector structures 330, overall device reliability can be significantly increased without adverse impact on the performance of the transistor functionality of the semiconductor device 500.

Figure 2:
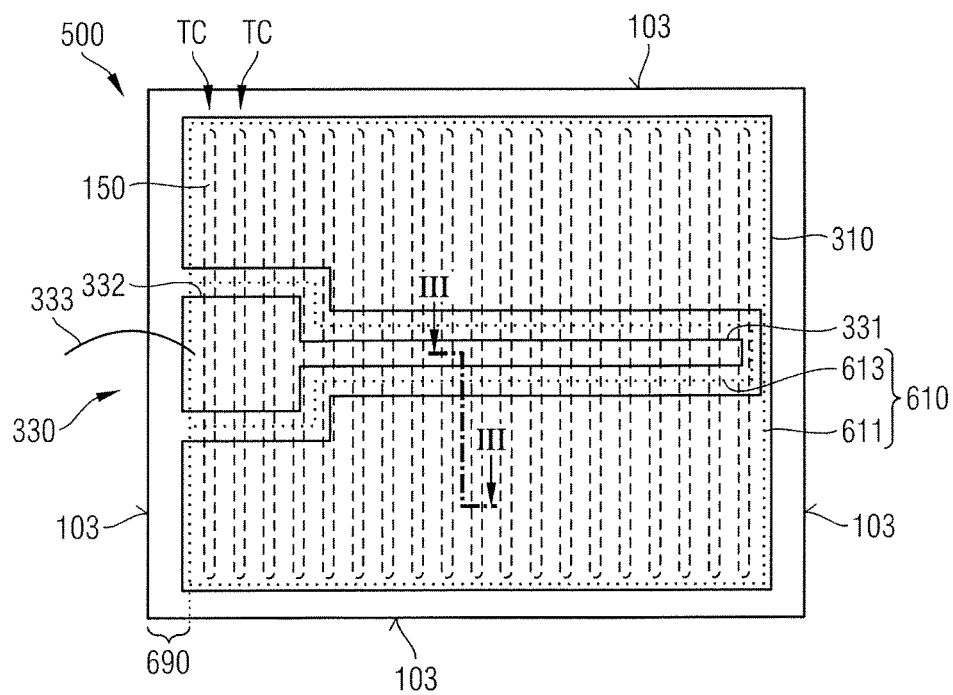
FIG. 2 is a schematic plan view of a semiconductor device including a gate pad and a gate finger according to an embodiment.

FIG. 2 shows the first load electrode 310 and a gate connector structure 330 at the front side of a semiconductor device 500. Trench gate structures 150 extend along a first horizontal direction through a transistor cell area 610. Within the transistor cell area 610 transistor cells TC are formed along the trench gate structures 150. The gate connector structure 330 includes a gate finger 331 that extends along a second horizontal direction intersecting the first horizontal direction. For example, the gate finger 331 extends orthogonal to the trench gate structures 150.

Contact structures extending from the gate finger 331 into the gate electrodes 155 electrically connect the gate electrodes 155 with the gate finger 331. The gate finger 331 may electrically connect the gate electrodes 155 with each other and with a gate pad 332. A bond wire 333 may be fixed, e.g., bonded or soldered to the gate pad 332.

Second sections 151b of the gate dielectric 151 below the gate finger 331 and the gate pad 332, i.e., in the vertical projection of the gate finger 331 and the gate pad 332 are thicker than first sections 151a outside the vertical projection of the gate finger 331 and the gate pad 332 but in the vertical projection of the first load electrode 310. An edge area 690 may surround the transistor cell area 610 and may separate the transistor cell area 610 from a side surface 103 at the edge of the semiconductor body 100.

Figure 3:
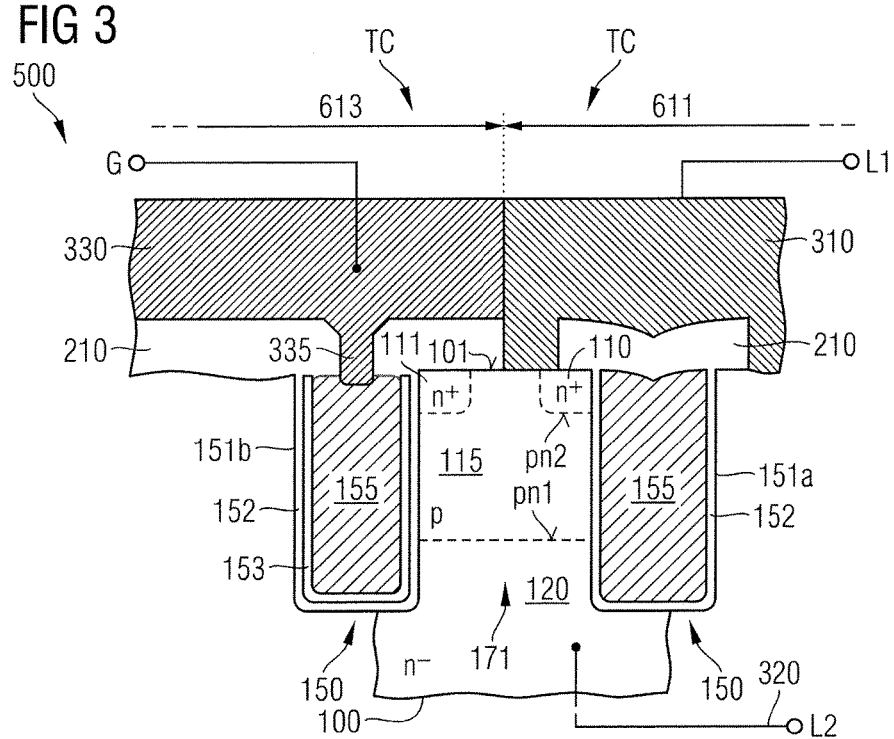
FIG. 3 is a schematic vertical cross-sectional view of a portion of a semiconductor device according to an embodiment concerning multilayer gate dielectrics in the vertical projection of gate connector structures.

FIG. 3 illustrates modifications of transistor cells TC in idle regions 613 in the vertical projection of the gate connector structures 330. For example, the idle regions 613 may include doped zones 111 forming pn junctions with the body zones 115. The doped zones 111 may contain the same dopant dose as the source zones 110, but, other than the source zones 110, the doped zones 111 are without any connection to the first load electrode 310. Gate contacts 335 extend through openings in the interlayer dielectric 210 and electrically connect the gate connector structure 330 with the gate electrodes 155.

The second sections 151b of the gate dielectrics 151 include one sublayer more than the first sections 151a. According to an embodiment, the second sections 151b include second portions of a first sublayer 152 with the same thickness and configuration, i.e., from the same material and with the same internal structure as first portions of the first sublayer 152 forming the first sections 151a, and, in addition, a second sublayer 153 which is absent in the first sections 151a. The second sublayer 153 may be formed before or after the first sublayer 152. According to an embodiment, the second portions of the first sublayer 152 are sandwiched between the second sublayer 153 and the semiconductor body 100. According to another embodiment, the second portions of the first sublayer 152 are sandwiched between the gate electrode 155 and the second sublayer 153.

Figure 4A:
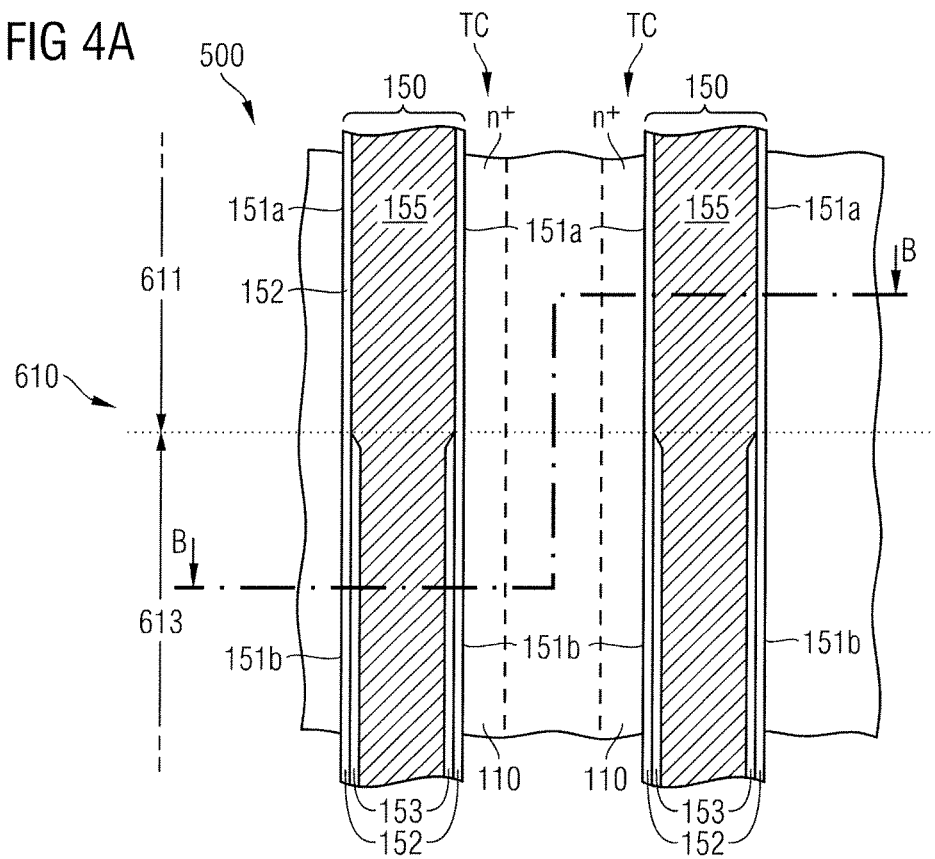
FIG. 4A is a schematic horizontal cross-sectional view of a portion of a semiconductor device according to an embodiment concerning multilayer dielectrics in idle regions.
Figure 4B:
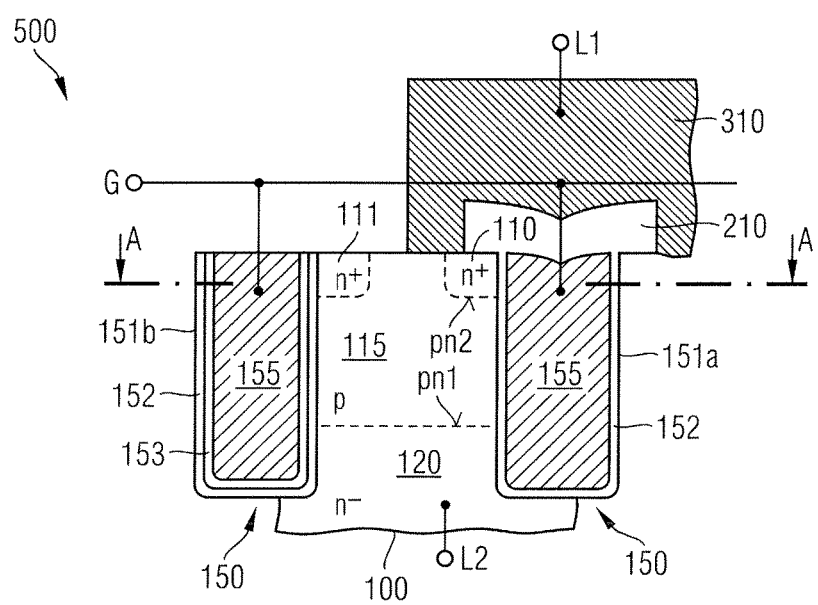
FIG. 4B is a schematic vertical cross-sectional view of the semiconductor device portion of FIG. 4A along line B-B.

FIGS. 4A to 4B refer to a semiconductor device 500 with transistor cells TC including stripe-shaped trench gate structures 150 that extend from a first surface 101 into a semiconductor body 100. Each transistor cell TC includes an active section through which a load current flows in a vertical direction when the transistor cell TC is in an on-state. The transistor cells TC further include idle sections through which no load current flows in the vertical direction when the transistor cell TC is in the on-state.

The idle sections may correspond to idle regions 613 of the transistor cell area 610 in the vertical projection of gate connector structures 330 and/or may correspond to end sections of the trench gate structures 150. Second sections 151b of the gate dielectrics 151 in the idle sections of the transistor cells TC include at least one layer more than first sections 151a of the gate dielectrics 151 in the active sections.

For example, the first sections 151a consist of first portions of a first sublayer 152, which may be a single layer or a layer stack, and the second sections 151b include, in addition to second portions of the first sublayer 152, a second sublayer 153, which also may be a single layer or a layer stack. According to the embodiment of FIG. 4A, the second sublayer 153 is formed after formation of the first sublayer 152 such that the second sublayer 153 is sandwiched between the gate electrode 155 and the first sublayer 152. The first sublayer 152 may be a thermally grown semiconductor oxide, such as silicon oxide grown on a silicon carbide semiconductor body 100. The second sublayer 153 may be a deposited dielectric layer such as deposited silicon oxide, by way of example. The embodiment of FIGS. 4A and 4B can be combined with any of the embodiments described with reference to the previous figures.

In FIG. 5A, the idle region 613 includes trench end sections 150z of the trench gate structures 150. In trench corners such as the end sections of stripe-shaped trenches the thickness of a grown or deposited dielectric layer may be reduced due to deviations of the actual shape of the trench endings from a perfectly rounded shape. Further, enhanced microtrenching may induce deviations of the form of the trench end structures from a perfectly rounded shape. According to an embodiment, the semiconductor body 100 is based on silicon carbide where the trench endings tend to a hexagonal shape. Increasing the thickness of the second sections 151b of the gate dielectrics 151 in the trench end sections 150z significantly increases device reliability.

The trench end sections 150z may be devoid of source zones such that in the on-state of the semiconductor device 500 no load current flows in the vertical direction through idle sections of the transistor cells TC along the trench end sections 150z. According to another embodiment, the trench end sections 150z do include source zones 110 but the thick second sections 151b of the gate dielectric 151 shift the local threshold of the transistor cell TC to a level beyond a maximum driving level, such that despite of the presence of source zones 110 in the on-state no load current flows in the vertical direction through the idle sections of the transistor cells TC along the trench end sections 150z.

According to the embodiment illustrated in FIG. 5B, the idle sections of the transistor cells TC along the trench end sections 150z are devoid of any doped zone corresponding to the source zones 110. According to other embodiments, the idle sections of the transistor cells TC along the trench end sections 150z include doped zones corresponding in position, dimension and dopant dose to the source zones 110 but without electric connection to the first load electrode 310.

FIG. 6 refers to an embodiment with the second sublayer 153 formed before the first sublayer 152. The second sublayer 153 is sandwiched between the first sublayer 152 and the semiconductor body 100 in the idle transistor sections 613.

Figure 7A:
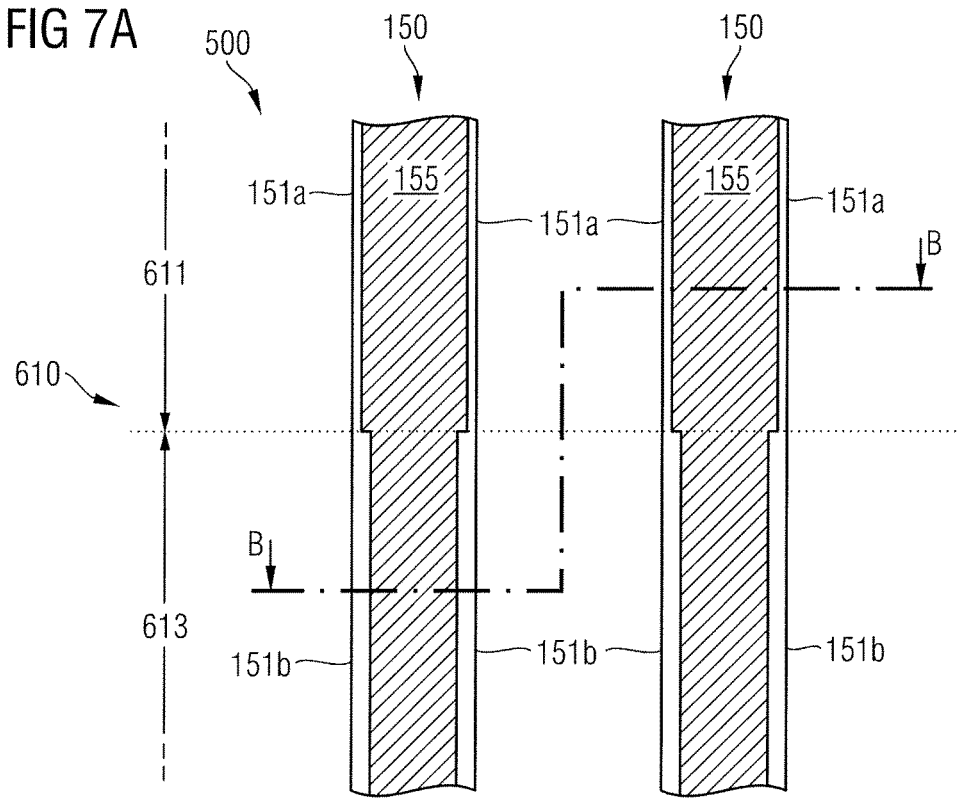
FIG. 7A is a schematic horizontal cross-sectional view of a portion of a semiconductor device with thick gate dielectrics sections in idle regions according to an embodiment based on silicon carbide.
Figure 7B:
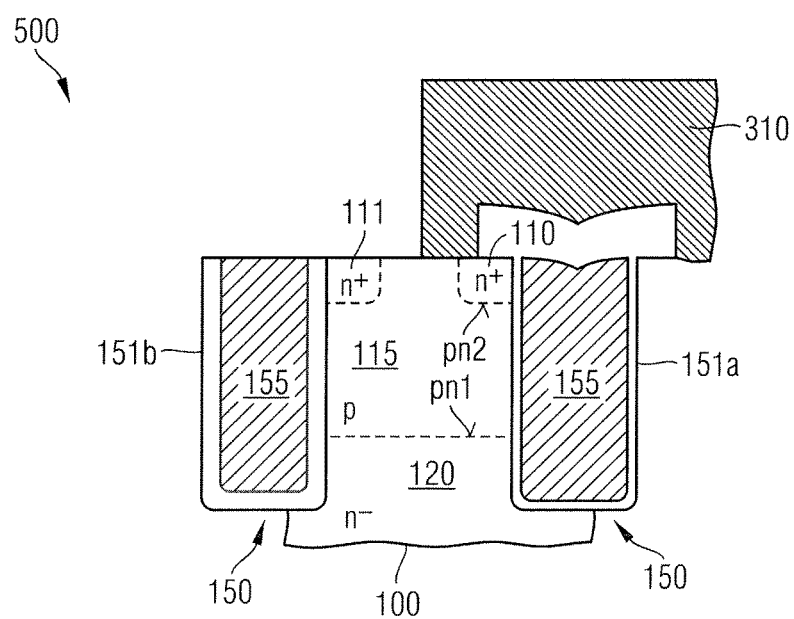
FIG. 7B is a schematic vertical cross-sectional view of the semiconductor device portion of FIG. 7A along line B-B.

FIGS. 7A to 7B refer to a semiconductor device 500 which semiconductor body 100 is formed from silicon carbide.

The semiconductor device 100 includes transistor cells TC based on stripe-shaped trench gate structures 150 that extend from a first surface 101 into the semiconductor body 100 of silicon carbide. The transistor cells TC include active sections through which a load current flows in a vertical direction when the transistor cells TC are in an on-state as well as idle sections through which no load current flows in the vertical direction in the on-state. A second section 151b of the gate dielectric 151 in the idle section is thicker than a first section 151a in the active section. The embodiment of FIGS. 7A and 7B can be combined with any of the embodiments described with reference to the previous figures.

Figure 8B:
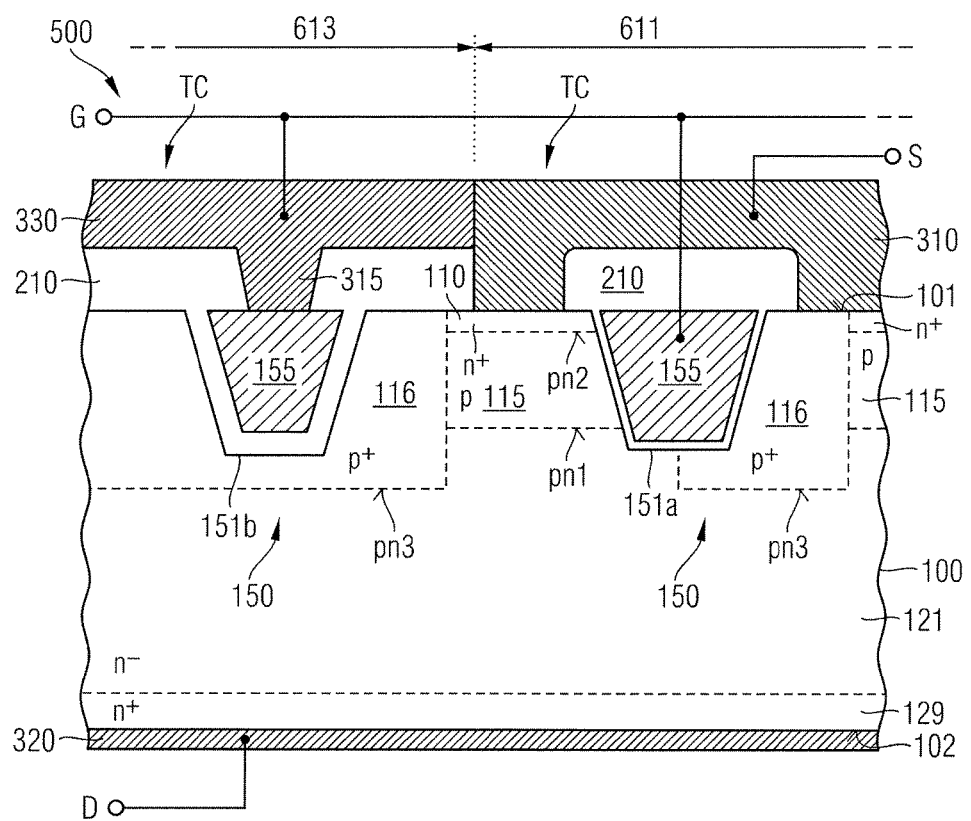
FIG. 8B is a schematic vertical cross-sectional view of the semiconductor device portion of FIG. 8A along line B-B.
Figure 8C:
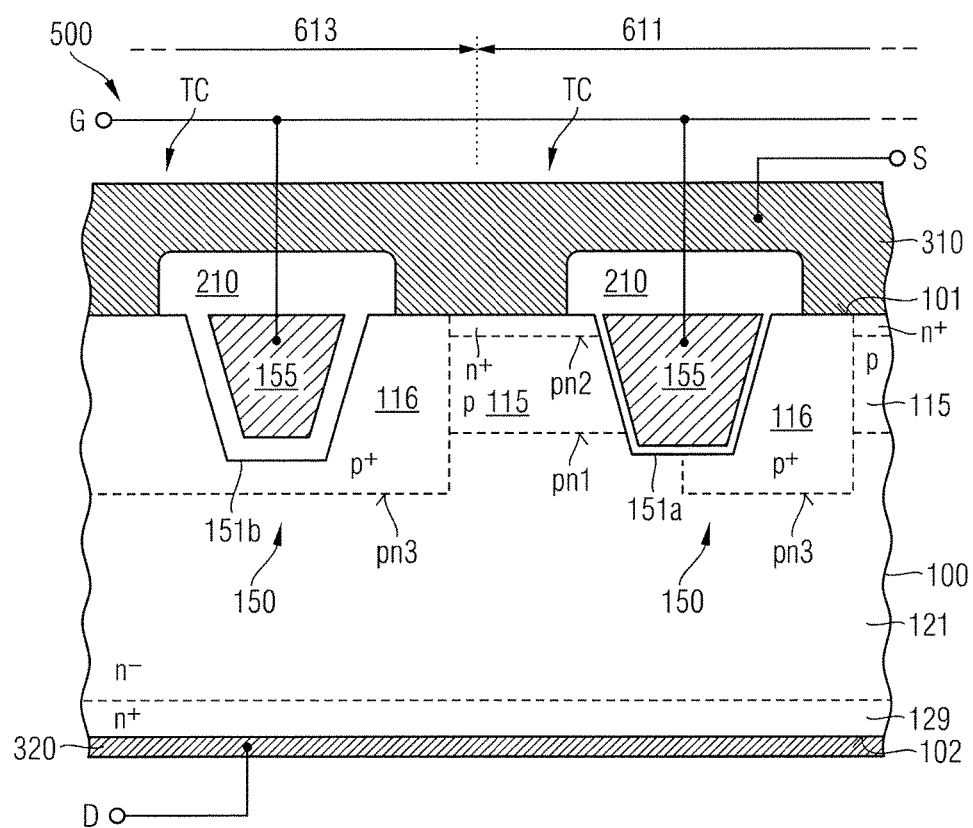
FIG. 8C is a schematic vertical cross-sectional view of the semiconductor device portion of FIG. 8A along line C-C.

The semiconductor device 500 illustrated in FIGS. 8A to 8C is an IGFET, which may be based on a semiconductor body 100 from silicon carbide with transistor cells TC formed along stripe-shaped trench gate structures 150 including gate electrodes 155 electrically connected or coupled to a gate terminal G and which first load electrode 310 is electrically connected or coupled to a source terminal S as described with reference to FIGS. 1A to 1B, respectively.

The drift structure 120 may include a heavily doped drain layer 129, which is formed along the second surface 102 at the reverse side of the semiconductor body 100 opposite to the first surface 101 at the front side. The drain layer 129 forms an ohmic contact with a second load electrode 320, which forms or which may be electrically connected to a drain terminal D. A maximum dopant concentration in the drain layer 129 along the second surface 102 may be at least 1E19 cm$^{-3}$, by way of example.

The drift structure 120 further includes a lightly doped drift zone 121 between the drain layer 129 and the body zones 115 of the transistor cells TC. A mean dopant concentration in the drift zone 121 may be in a range from 1E14 cm$^{-3}$ to 1E17 cm$^{-3}$, by way of example. Diode regions 116 electrically connected to the first load electrode 310 may extend between the first surface 101 and the drift zone 121. The diode regions 116 may form third pn junctions pn3 embodying a body diode of the semiconductor device 500 and/or may shield the gate dielectrics 151 against the drain potential in a reverse blocking state.

The semiconductor device 500 includes idle regions 613 both along trench end sections 150z of the trench gate structures 150 and in the vertical projection of gate connector structures 330, which may include gate fingers 331, gate runners and gate pads 332, by way of example. A thickness of second sections 151b of the gate dielectrics 151 in the idle regions 613 exceeds a thickness of first sections 151a in active regions 611 by at least 20%. Each of the first and second sections 151a, 151b may be a single layer or a layer stack.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a transistor cell that comprises a trench gate structure extending from a first surface into a semiconductor body;
    a gate connector structure at a distance to the first surface and at a distance to end sections of the trench gate structure, and electrically connected to a gate electrode in the trench gate structure;
    a gate dielectric separating the gate electrode from the semiconductor body, wherein an active section of the gate dielectric is thinner than sections elsewhere within the trench gate structure; and
    wherein the active section comprises a first portion of a first sublayer and the sections of the gate dielectric elsewhere comprise a second sublayer, which is absent in the active section, and a second portion of the first sublayer.

2. The semiconductor device of claim 1, wherein the gate connector structure includes a gate pad and a bond wire fixed to the gate pad.

3. The semiconductor device of claim 1, wherein the gate connector structure includes a gate finger crossing a plurality of gate trench structures and electrically connected to the gate electrodes in the gate trench structures.

4. The semiconductor device of claim 1, wherein the gate dielectric comprises a further second section in a trench end section of the trench gate structure.

5. The semiconductor device of claim 1, wherein the semiconductor body is based on silicon carbide.

6. A semiconductor device, comprising:
    a transistor cell that comprises a trench gate structure extending from a first surface into a semiconductor body, wherein the transistor cell includes an active section through which a load current flows in a vertical direction perpendicular to the first surface when the transistor cell is in an on-state and an idle section through which no load current flows in the vertical direction when the transistor cell is in the on-state; wherein
    a second section of a gate dielectric in the idle section includes at least one sublayer more than a first section of the gate dielectric in the active section.

7. The semiconductor device of claim 6, wherein a thickness of the second sections exceeds a thickness of the first sections by at least 20%.

8. The semiconductor device of claim 6, further comprising:
    a gate connector structure electrically connected to a gate electrode in the trench gate structure and formed at a distance to the first surface, wherein at least a portion of the idle section is formed in a vertical projection of the gate connector structure.

9. The semiconductor device of claim 8, wherein the gate connector structure includes a gate pad and a bond wire fixed to the gate pad.

10. The semiconductor device of claim 8, wherein the gate connector structure includes a gate finger crossing a plurality of gate trench structures.

11. The semiconductor device of claim 6, wherein the semiconductor body is based on silicon carbide.

12. The semiconductor device of claim 6, wherein the first section comprises a first portion of a first sublayer and the second section comprises a second sublayer, which is absent in the first section, and a second portion of the first sublayer.

13. A semiconductor device, comprising:
    a transistor cell that comprises a trench gate structure extending from a first surface into a semiconductor body, wherein the transistor cell includes an active section through which a load current flows in a vertical direction perpendicular to the first surface when the transistor cell is in an on-state and an idle section through which no load current flows in the vertical direction when the transistor cell is in the on-state; wherein
    a second section of a gate dielectric in the idle section is thicker than a first section of the gate dielectric, in the active section and separates a gate electrode in the trench structures from body zones.

14. The semiconductor device of claim 13, further comprising:
    a gate connector structure electrically connected to the gate electrode in the trench gate structure and formed in a distance to the first surface, wherein at least a portion of the idle section is formed in a vertical projection of the gate connector structure.

15. The semiconductor device of claim 13, wherein the gate connector structure includes a gate pad and a bond wire fixed to the gate pad.

16. The semiconductor device of claim 13, wherein the gate connector structure includes a gate finger crossing a plurality of gate trench structures.

17. The semiconductor device of claim 13, wherein the second section of the gate dielectric in the idle section includes at least one layer more than the first section of the gate dielectric in the active section.

18. The semiconductor device of claim 13, wherein the first section comprises a first portion of a first sublayer and the second section comprises a second sublayer, which is absent in the first section, and a second portion of the first sublayer.

19. The semiconductor device of claim 13, wherein the semiconductor body is based on silicon carbide.

\* \* \* \* \*